United States Patent [19]
Kertis

[11] Patent Number: 5,220,532
[45] Date of Patent: Jun. 15, 1993

[54] SELF-LOCKING LOAD STRUCTURE FOR STATIC RAM

[75] Inventor: Robert A. Kertis, Puyallup, Wash.

[73] Assignee: National Semiconductor Corporation, Santa Clara, Calif.

[21] Appl. No.: 533,987

[22] Filed: Jun. 6, 1990

[51] Int. Cl.$^5$ ............................................. G11C 13/00
[52] U.S. Cl. ................................. 365/190; 365/189.03; 365/189.04
[58] Field of Search .............. 365/189.01, 203, 189.03, 365/189.04, 190

[56] References Cited

U.S. PATENT DOCUMENTS 4,774,203  9/1988  Ikeda et al. ........................... 437/52
4,930,112  5/1990  Tanaka et al. ........................ 365/226

FOREIGN PATENT DOCUMENTS 0320405  6/1989  European Pat. Off. .

Primary Examiner—Terrell W. Fears
Attorney, Agent, or Firm—Townsend and Townsend

[57] ABSTRACT

A self-locking load structure for Random Access Memories is disclosed. The load structure remains coupled to the memory cell during read operations but automatically decouples from the memory during write operations. No separate decoded WRITE command must be sent to the load structure to couple and decouple the structure from the memory cell.

16 Claims, 4 Drawing Sheets

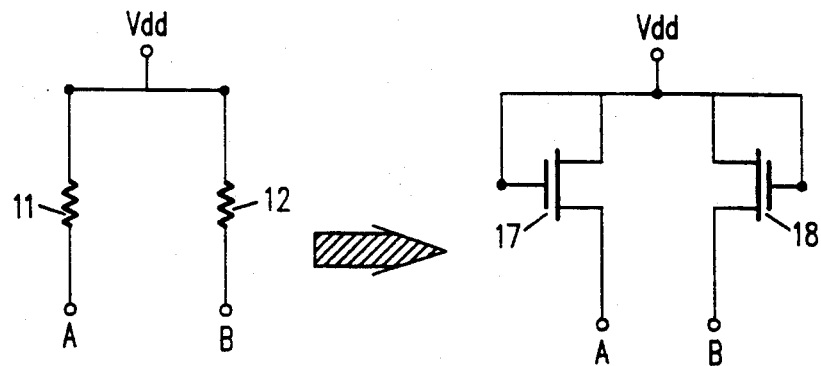
PRIOR ART
FIG. 3A
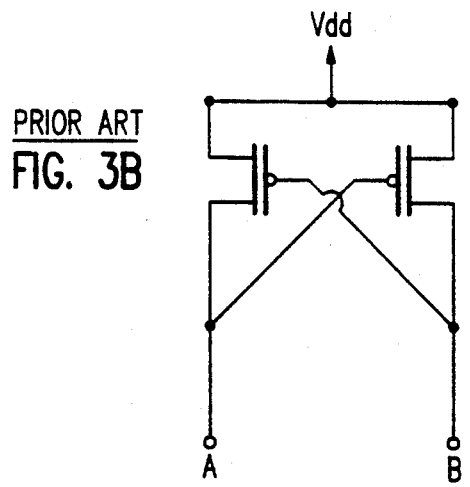
PRIOR ART
FIG. 3B
FIG. 4
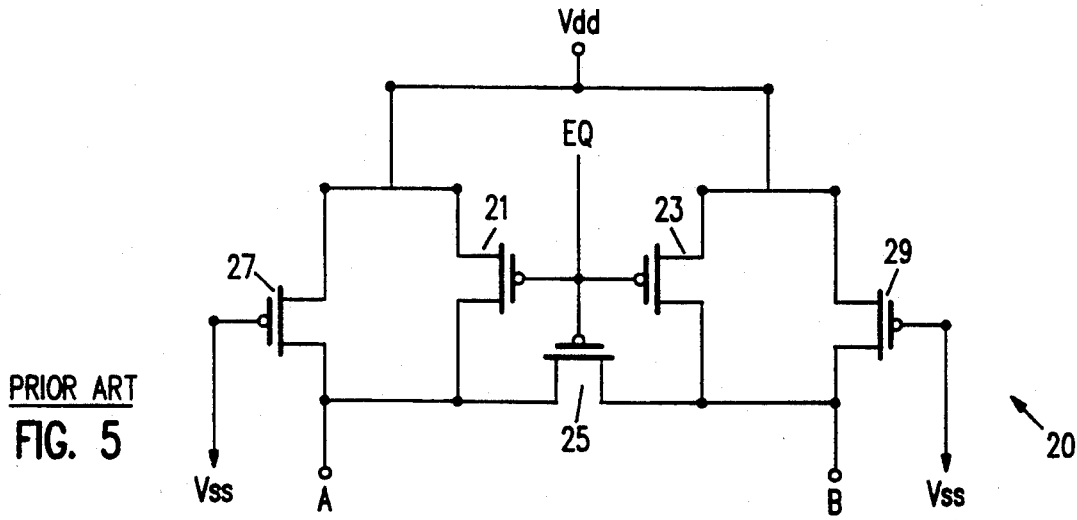
PRIOR ART
FIG. 5

SELF-LOCKING LOAD STRUCTURE FOR STATIC RAM

BACKGROUND OF THE INVENTION

1. Field of the Invention

This invention is in the field of integrated circuit memories. More particularly, it relates to a Static Random Access Memory ("SRAM") which does not require a separate write signal to the bit line load structures of the SRAM during the write cycle to decouple the load structures from the SRAM memory cells.

2. Description of the Relevant Art

Integrated circuit memories which do not require periodic refreshing to maintain integrity of the data stored within them, in particular, SRAMs, are known. Typically, an SRAM memory is constructed by fabricating an array of memory cells and peripheral circuitry on a single integrated circuit chip. Using present manufacturing techniques, state of the art SRAMs incorporate about one million cells.

An example of an SRAM memory cell is shown in FIG. 1. Memory cell 10 comprises flip-flop transistors 13 and 14, gating transistors 15 and 16 and load resistors 11 and 12. The cell is individually accessed by means of the word line, and output signals from the cell are provided on the Bit and $\overline{\text{Bit}}$ lines. Although the construction and operation of such a memory cell is known, a brief review is appropriate to establish the operational environment of the present invention.

Transistor 14 and resistor 12 are the driver and load of an inverter that is cross-coupled to a second inverter formed from transistor 13 and resistor 11. Together, the two inverters form a storage flip-flop. Transistors 15 and 16, when on, couple the output of the flip-flop to the Bit and $\overline{\text{Bit}}$ lines, which provide the memory cell's information to an output sense amplifier (not shown).

The technique for reading the cell is as follows. In a quiescent state, the word line is at $V_{ss}$ potential, which isolates the memory cell from the Bit and $\overline{\text{Bit}}$ lines as transistors 15 and 16 do not conduct when their gates are at $V_{ss}$ potential. If the binary information stored in the cell is such that transistor 14 is assumed to be on, then node A will be at $V_{dd}$. To read the memory cell, the word line is pulsed high. This turns on both transistors 15 and 16. As node A is at approximately $V_{dd}$, current will flow through the $\overline{\text{Bit}}$ line. A load structure on the bit lines, not shown in FIG. 1, establishes a differential voltage on the bit lines by means of the cell current through the load. When the Read command turns on transistors 15 and 16, the current flowing through the Bit line will be compared to the current flowing through the $\overline{\text{BIT}}$ line by a differential sense amplifier (not shown). Depending upon the relative potentials of Bit and $\overline{\text{Bit}}$, the information from the memory cell will be considered a binary 0 or 1.

Writing to the cell requires that the appropriate values be placed on the Bit or $\overline{\text{BIT}}$ line by write amplifiers (not shown). The word line is then pulsed and nodes A and B are reset to the desired voltage as necessary. Both bit lines must be driven simultaneously when a write is commanded.

FIG. 2 illustrates how individual memory cells are interconnected into an SRAM. The individual memory cells are arranged in row and columns. The numbers in the lower right corner of each cell indicate the row and column in which the cell is situated. Each row has an address line, here labeled Word$_0$, Word$_1$ and Word$_n$, coupled to each cell. Additionally, each column of memory cells is coupled to separate Bit and $\overline{\text{Bit}}$ lines. In addition to the load structure for each individual memory cell, each column of memory cells has a load structure to provide the necessary voltage differential for the sense amplifier.

Referring back to FIG. 1, resistors 11 and 12 comprise a passive load structure for a single memory cell. In addition to this type of load structure for memory cell 10 shown in FIG. 1, other load structures can be used. FIG. 3A shows how resistors 11 and 12 of FIG. 1 could be replaced by NMOS transistors 17 and 18; the drains and gates of both transistors being coupled to the memory cell's voltage supply. FIG. 3B shows how PMOS transistors could be used to construct the load structure.

FIG. 4 is a graph illustrating the change in voltages on the Bit and $\overline{\text{Bit}}$ lines when a transition is made from one cell to another cell on the same column during a read cycle, for example when a read operation first reads one cell in a column, then reads another cell in the same column. In the example of FIG. 4, the information contained in the first cell is the inverse of the information in the other cell. During the transition between the two read operations, the voltage on the Bit line starts dropping as the voltage on the $\overline{\text{Bit}}$ line begins to rise. The minimum time required for the $\overline{\text{Bit}}$ line voltage to equal and then exceed the Bit line voltage, labeled in FIG. 4 as $\Delta T$, is referred to as the memory cell's switching time. The switching time determines the overall speed of the memory. Any technique which can speed either the fall or rise time of either or both the $\overline{\text{Bit}}$ or Bit line will improve overall memory performance.

The switching time is determined by numerous factors. For purposes of this invention, one of the most important factors is the Resistor/Capacitor ("RC") time constant, which is created by the capacitances present on the Bit and $\overline{\text{Bit}}$ lines and the resistance of the bit line column load structure. The capacitance on the Bit and $\overline{\text{Bit}}$ lines results from the intrinsic capacitance of the drains of transistors 15 and 16 in FIG. 1. The resistance is mainly a function of the bit line column load's resistance. As is apparent, lowering the resistance will have a direct beneficial effect on the switching time, by reducing the RC time constant. One method of reducing the R value is to use larger NMOS or PMOS transistors, resulting in an improvement in the switching time. With larger transistors, the differential between the logic 0 and 1 voltage levels is smaller and the resistance is less.

Certain active techniques have also been used to improve the switching time. One bit line column load structure embodying a technique called Address Transition Detection is shown in FIG. 5. In circuit 20, transistors 27 and 29 are PMOS transistors and serve as the bit line load for a column of memory cells. Transistors 21, 23 and 25 form a pull-up network. When an address input transition occurs, the EQ ("Equalize") node is pulsed low. This turns on transistors 21 through 25 thereby placing additional resistance in parallel with load transistors 27 and 29. This decreases the resistance of the load, resulting in a harder and faster pull-up to the high voltage, and shorts both bit lines to the same high voltage level. Now, when the new memory cell is accessed, the bit lines have already been shorted together, thereby establishing a high voltage level on both nodes. The new cell only needs have to pull the voltage low on one of the nodes to complete the switching of the voltage levels, establishing new voltage differentials for reading.

Unfortunately, the bit line column load structure suffers from certain disadvantages when it is necessary to write a value to the memory cell. When a new value is written to a given memory cell, the old value must be destroyed. One way of doing this is to discharge the voltage at either node A or B (FIG. 1) to $V_{ss}$, the ground potential. This is done by pulling Bit or $\overline{\text{Bit}}$ low to write the low level into the cell. Unfortunately, the bit line load structure in the SRAM memory holds the bit line nodes to almost $V_{dd}$. Therefore, to change the voltages on nodes A and B, it is necessary to decouple the memory cell from its bit line load structure.

One bit line column load structure which can be decoupled during write operations is shown in FIG. 6. In the illustrated circuit, when the Write Enable ("WE") signal goes high, PMOS transistors 32 and 33 turn off, reducing the load on the bit lines. Although this type of circuit functions adequately, the necessity of having a separate WE signal provided to the memory cell bit line loads is undesirable as the signal must be decoded before it can be transmitted to the proper column of memory cells in a large array, thereby slowing circuit operation.

A need exists for a load structure for a column of memory cells which can be decoupled from the column of memory cells without the use of a separate "release" signal and which can decrease the switching time for the memory cell to which it is coupled.

SUMMARY OF THE INVENTION

The present invention provides a self-locking bit line load structure for a column of SRAM memory cells. We use the term self-locking to mean that no separate command signal or separate write line is required to decouple the load from the memory cell during write operations. The signals used to write the cell automatically decouple the load, without any specific write enable signal. The load structure also decreases the individual memory cell's switching time.

In a preferred embodiment of the present invention, the self-locking load circuit comprises a pi network of PMOS transistors coupled to a NAND gate comprised of PMOS and NMOS transistors and the Bit and $\overline{\text{Bit}}$ lines. During reading operations, the NAND gate allows current to flow through the pi network. This memory cell current creates the cell's differential voltage which is sensed and amplified by an output sense amplifier. When the cell is written to, the NAND gate prevents current flow through the pi network. With the pi network disconnected, the load is effectively decoupled from the column of memory cells. In an alternate embodiment, the pi network is simplified to a single PMOS transistor on each of the Bit and $\overline{\text{Bit}}$ lines. The alternate embodiment is simpler to construct, but requires more surface area to fabricate.

The invention will now be described in conjunction with the following figures.

BRIEF DESCRIPTION OF THE DRAWINGS

FIGS. 3A and 3B illustrate how a passive resistor load can be replaced by an active NMOS or PMOS transistor load for an SRAM memory cell;

FIG. 4 is a graph showing the state transitions of bit lines occurring on a column of SRAM memory cells during read operations;

FIG. 5 shows a prior art active bit line load structure for SRAM memories;

FIGS. 8A and 8B illustrate preferred embodiments of the self-locking bit-line load structure of the present invention.

DETAILED DESCRIPTION OF THE PREFERRED EMBODIMENTS

Figure 7:
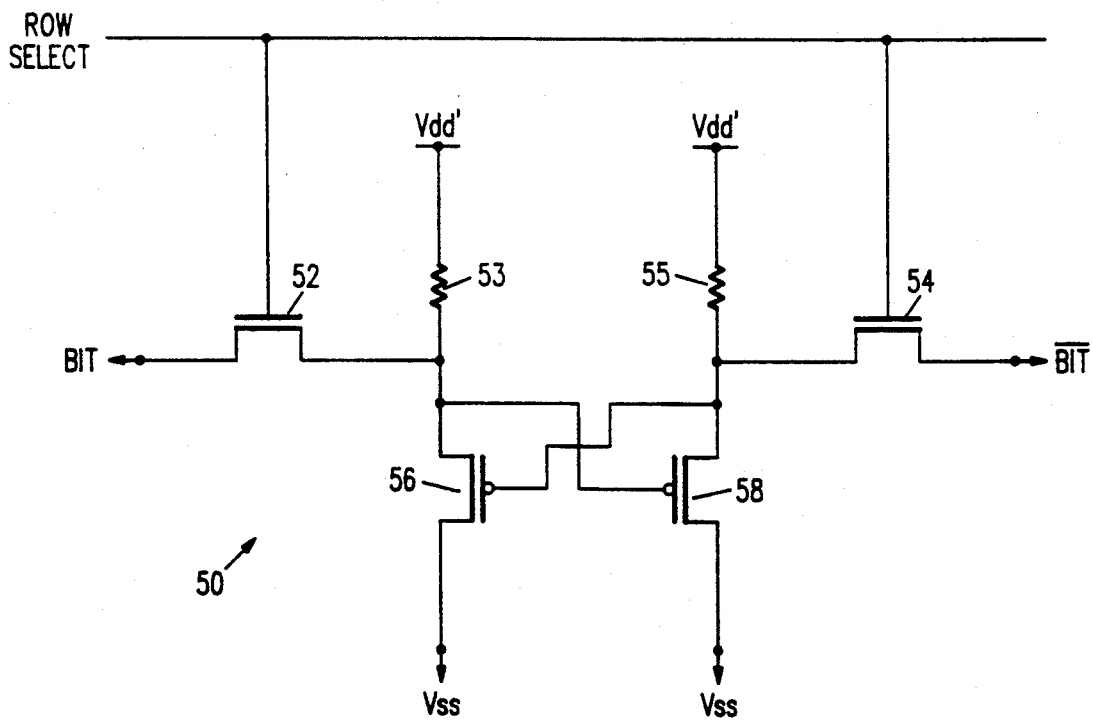
FIG. 7 is an SRAM memory cell used in the present invention.

FIG. 7 shows an SRAM memory cell 50 as implemented in the present invention. It is conventional in the sense that transistors 56 and 58 form a storage flip-flop. In the preferred embodiment, the transfer gate size for transistors 52 and 54 is 0.7 $\mu$ width and 0.9 $\mu$ length. The increase to 0.9 $\mu$ for the transfer gates increases the $\beta$ ratio of memory cell 50. Cross-coupled pull-down transistors 56 and 58 of the storage flip-flop have transfer gate sizes of 2.8 $\mu$ width and 0.8 $\mu$ length. The loads of the cell, illustrated as resistors 53 and 55, are comprised of polysilicon doped to a resistance of approximately 10 G ohms. Memory cell 50 has one row select line (or word line) coupled to transfer gate transistors 52 and 54. $V_{dd}'$ and $V_{ss}$ are fabricated in the first layer metal of the chip. The row select line is fabricated using the first layer of polysilicon. Although specific details of the construction of the memory cell used in the preferred embodiment of this invention are described, nothing herein should be taken to limit this invention to these particular device values and sizes. Changes in both size and device value are contemplated and within the scope of the present invention.

Figure 8A:
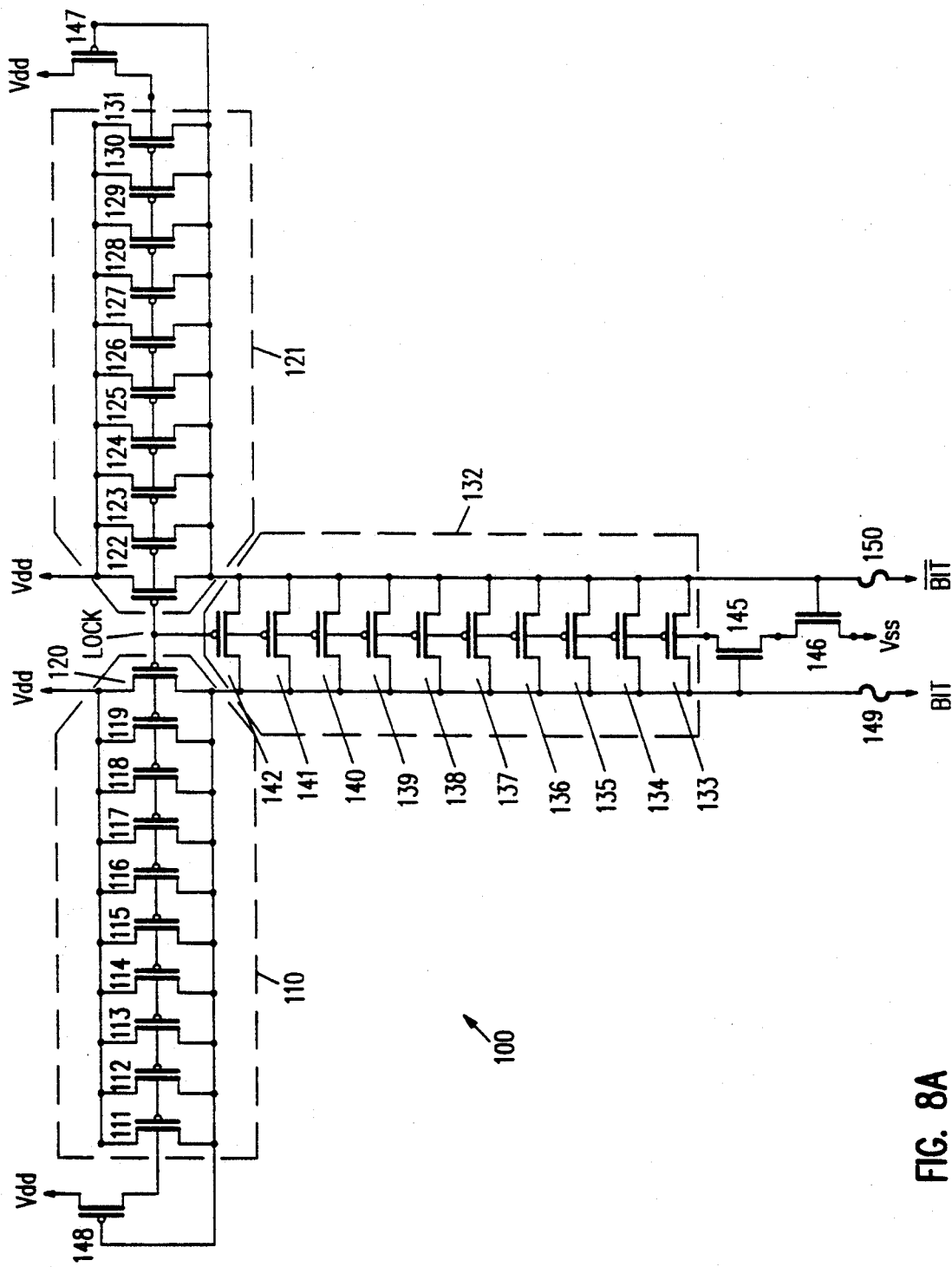

A preferred emobodiment of the load structure of the present invention is shown in FIG. 8A. Self-locking load structure 100 is a 3 branch transistor pi network which provides a low resistance for a given circuit layout area. The transistors which comprise the load structure, groups of PMOS transistors 110, 121, and 132 are in turn comprised of narrow 0.7 $\mu$ transistors 111 through 120, 122 through 131, and 133 through 142, respectively. This "chopping-up" of a large transistor into smaller transistors coupled in parallel minimizes bit-line differential variations caused by variations in critical dimension from wafer to wafer. These variations occur during manufacturing. Transistors 148, 147, 145, and 146 comprise a NAND gate which effectively monitors the voltage of the bit lines. In memories with redundant columns fuses 150 and 149 can be used to disconnect a defective column from the bit line loads. In the preferred embodiment the fuses are blown to disconnect the column.

A simplified drawing of the load structure 100 is shown in FIG. 8B, and the operation of the load structure will be discussed referring to this figure. In the simplified drawing, PMOS transistors 111 through 120 in group 110 of FIG. 8A have been represented as a single PMOS device 110. Similarly, devices 122 thrugh 131 are shown in FIG. 8B as a single device 121, and devices 133 through 142 are shown as device 132. During READ operations, both Bit and $\overline{\text{Bit}}$ lines are high. NMOS transistors 145 and 146 are on and conducting, while PMOS transistors 147 and 148 are off. The pi load structure comprised of transistors 110, 121 and 132 turn on and conduct because node A is held low ($V_{ss}$) by conducting NMOS transistors 145 and 146. The selected memory cell current through the load structure creates the bit lines' differential voltage which is sensed and amplified by the differential voltage sense amplifier, not illustrated here.

During writing operations, one bit line goes low. The NAND gate comprised of transistors 145 through 148 recognizes this and changes state. One of transistors 145 or 146 turns off (non-conductive) and transistor 147 or 148 turns on and conducts. For example, if $\overline{\text{Bit}}$ goes low, transistor 146 turns off and transistor 147 turns on. Node A in turn goes to a logic high state, turning off the pi load's transistors 110, 121, and 132. Turning off the load eliminates the DC current path through transistors 110, 121 and 132 of the load while the column is being written. With the load off, the higher of the bit lines needs to be supported by an alternate load circuit. An individual bit line recovery circuit which performs this role is described in co-filed application entitled "Individual Bit Line Recovery Circuits." That disclosure is incorporated herein in its entirety by reference.

When writing operations are complete, the low bit line goes high because the voltages on the bit lines must be recovered from their multiple volt differential during writing operations to a voltage differential of approximately 100 millivolts during reading operations. Both transistor 145 and 146 turn back on, transistors 147 and 148 turn off and the voltage at node A goes low again, turning the load back on (transistors 110, 121, and 132).

Figure 1:
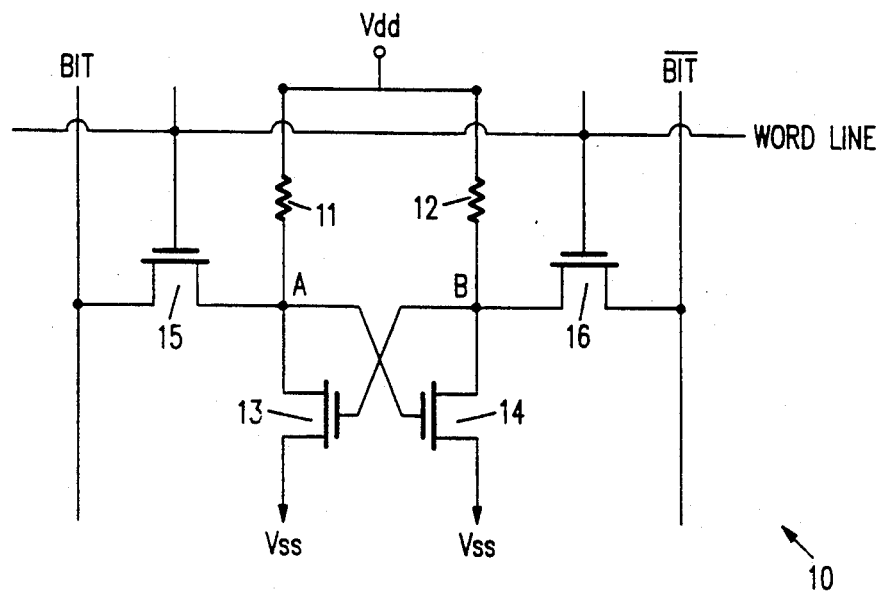
FIG. 1 depicts one known type of a conventional SRAM memory cell.
Figure 2:
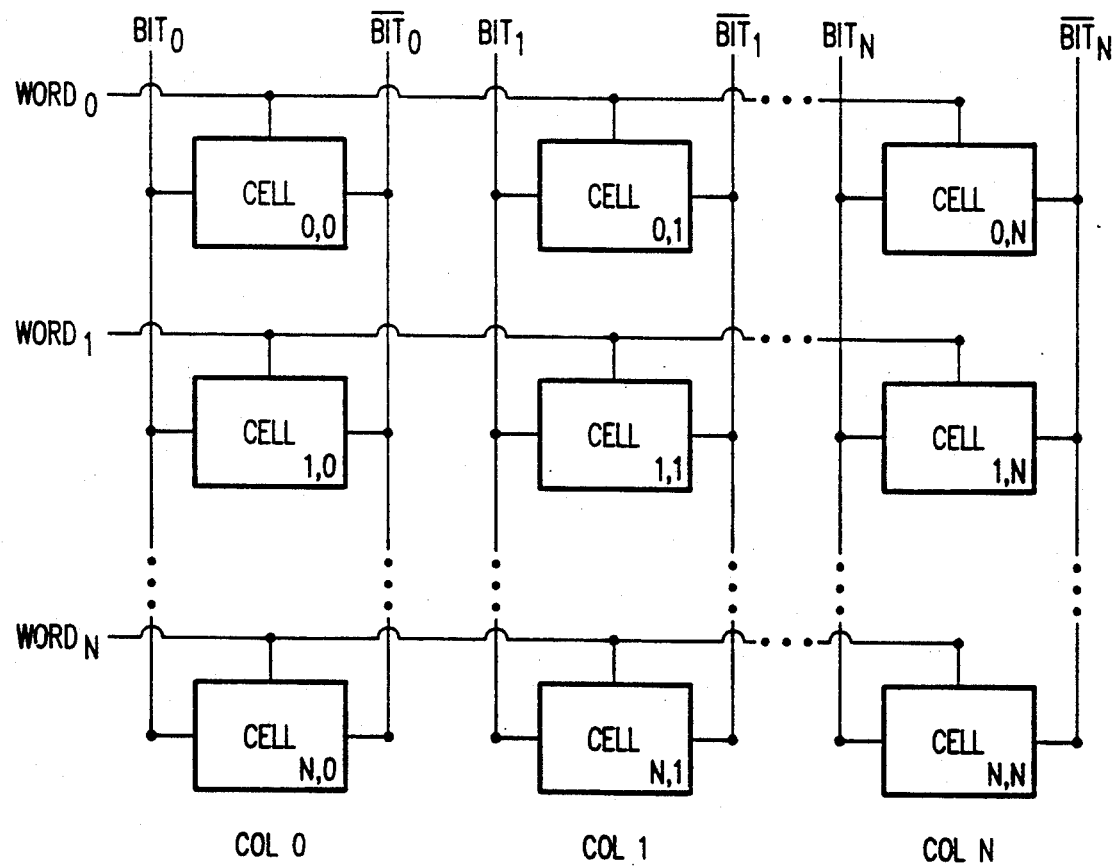
FIG. 2 depicts a conventional array of SRAM memory cells.
Figure 6:
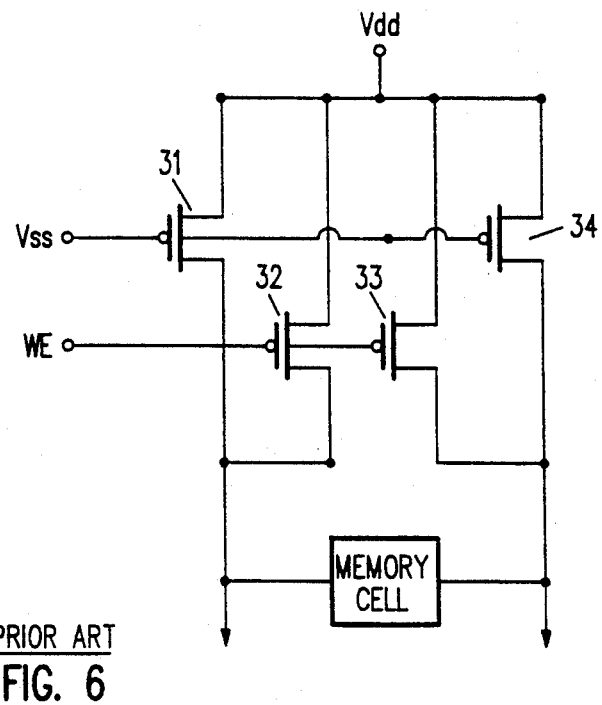
FIG. 6 illustrates a prior art bit line load structure for an SRAM memory which requires a write enable signal to decouple it from the column of memory cells.

One of the advantages of the described load structure is that no external writing signals, such as described in conjunction with FIG. 6, were required to turn the load off. This helps to reduce AC operating current during a WRITE operation by reducing or eliminating signal line capacitance, and speeds circuit operation.

In an alternate embodiment, the pi network comprised of transistors 110, 121, and 132 (FIG. 8B) could be simplified to include just transistors 110 and 121. Although the circuit would be simpler without transistor 132, both transistors in the alternative embodiment would need to be enlarged to maintain the same differential voltage levels created by the pi network. Also, the alternate embodiment does not allow for the shorting of the Bit and $\overline{\text{Bit}}$ lines together; the function performed by transistor 132.

Although the present invention has now been described in one preferred embodiment, the invention is not limited to only that embodiment. For example, referring to FIG. 8B, instead of coupling the drains of transistors 147 and 148 to node A, they could each be coupled to the input of an inverter. The output of the two inverters could then be coupled to the gates of transistors 110, 121, and 132, which would be realized as NMOS transistors in this new embodiment. Potential applications of the invention are also not limited to those described herein. For example, this self-locking load structure may be equally useful in a DRAM memory and other types of memory where a load structure is needed. Consequently, this specification should be read and interpreted in a broad, not narrow, sense. The scope of the invention is defined in the claims appended hereto.

I claim:

1. A load structure for a random access memory cell having a voltage supply, a true output line and a complement output line, the load structure comprising:

a pi network of transistor means coupled to the voltage supply and the true and complement output lines;

load structure logic means, coupled to the pi network of transistor means, the voltage supply and the true and complement output lines, the load structure logic means changing state when the memory cell is written to, the change of state turning off the network of transistor means and decoupling the load structure from the memory cell.

2. The load structure of claim 1 wherein the load structure logic means is a NAND logic means.

3. The load structure of claim 1 wherein the pi network of transistors comprises PMOS transistors having commonly coupled gates.

4. The load structure of claim 3 wherein the pi network comprises first, second and third commonly coupled legs, each leg including a plurality of transistors having control electrodes coupled to a first node, first electrodes connected in parallel and second electrodes connected in parallel.

5. The load structure of claim 4 wherein:

the first electrodes of the transistors in the first and third legs are coupled to a first source of electrical signals;

the second electrodes of the transistors in the first leg are coupled to the true output line; and the second electrodes of the transistors in the third leg are coupled to the complement output line.

6. The load structure of claim 5 wherein:

the first electrodes of the transistors in the second leg are connected to the true output line, and the second electrodes of the transistors in the second leg are connected to the complement output line.

7. The load structure of claim 6 wherein the NAND logic means comprises:

a first transistor having a control electrode connected to the true output line and having a first electrode connected to the first node and a second electrode; and a second transistor having a control electrode coupled to the complement output line, a first electrode connected to the second electrode of the first transistor and a second electrode connected to a source of electrical signals.

8. The load structure of claim 7 wherein the NAND logic further comprises:

a third transistor having a control gate connected to the true output line and having a first electrode connected to the first node and a second electrode connected to the voltage supply; and a fourth transistor having a control gate connected to the complement output line and having a first electrode connected to the first node and a second electrode connected to the voltage supply.

9. The load structure of claim 8 wherein each of the first, second, third and fourth transistors comprises a field effect transistor.

10. The load structure of claim 9 wherein the first and second field effect transistors are NMOS field effect transistors and the third and fourth field effect transistors are PMOS field effect transistors.

11. The load structure of claim 6 wherein each of the plurality of transistors in each leg comprise field effect transistors.

12. The load structure of claim 11 wherein the field effect transistors are PMOS field effect transistors.

13. The load structure of claim 2 wherein the network of transistor means comprises first transistor means coupled to the true output line, the voltage supply and the load structure logic means and second transistor means coupled to the complement output line, the voltage supply, and the load structure logic means.

14. A method for decoupling a load structure including a pi network of transistors and logic means from a memory cell comprising the steps of:
   detecting with the logic means a start of a write operation to the memory cell; and
   decoupling the pi network of transistors from the memory cell in response to the detection of the write operation.

15. A load structure for a static random access memory cell, the cell having a voltage supply, a ground supply, an output line and a complement output line, the load structure comprising:
   NAND gate means comprising four field effect transistor means having gates, sources and drains, the first and second transistor means comprising PMOS transistors, and the third and fourth transistor means comprising NMOS transistors, the sources of the first and second transistors being coupled to the voltage supply, the gates of the first and third transistors being coupled to the output line, the gates of the second and fourth transistors being coupled to the complement output line, the drain of the third transistor and the source of the fourth transistor being coupled together, the drain of the fourth transistor being coupled to the ground supply, and the drains of first and second transistors and the source of the third transistors being coupled together to a first node; and
   Load structure means comprising fifth, sixth and seventh field effect transistor means having gates, sources, and drains, the fifth, sixth, and seventh transistors comprising PMOS transistors, the gates of the fifth, sixth, and seventh transistors being coupled to the first node, the sources of the fifth and seventh transistors both being coupled to the voltage supply, the drain of the fifth transistor and the source of the sixth transistor being coupled to the output line and the drains of the sixth transistor and seventh transistor both being coupled to the complement output line.

16. A load structure for a digital logic means, the digital logic means having a voltage supply, a true output line and a complement output line, the load structure comprising:
   a pi network of transistor means coupled to the voltage supply and the true and complement output lines;
   load structure logic means, coupled to the pi network of transistor means, the voltage supply and the true and complement output lines, the load structure logic means changing state when the digital logic means changes state, the change of state turning off the network of transistor means and decoupling the load structure from the memory cell.

* * * * *